US011503751B2

(12) United States Patent
Badihi et al.

(10) Patent No.: US 11,503,751 B2
(45) Date of Patent: Nov. 15, 2022

(54) METHOD, SYSTEM AND PAINT FOR EMI SUPPRESSION

(71) Applicant: MELLANOX TECHNOLOGIES, LTD., Yokneam (IL)

(72) Inventors: Avner Badihi, Nataf (IL); Pavel Vilner, Haifa (IL); Inbar Gozlan, Kfar Bialik (IL); Amir Pinhasovich, Holon (IL)

(73) Assignee: MELLANOX TECHNOLOGIES, LTD., Yokneam (IL)

(*) Notice: Subject to any disclaimer, the term of this patent is extended or adjusted under 35 U.S.C. 154(b) by 0 days.

(21) Appl. No.: 17/092,480

(22) Filed: Nov. 9, 2020

(65) Prior Publication Data
US 2021/0059084 A1   Feb. 25, 2021

Related U.S. Application Data

(63) Continuation of application No. 16/521,607, filed on Jul. 25, 2019, now Pat. No. 11,191,197.

(51) Int. Cl.
| H05K 9/00 | (2006.01) |
| C09D 5/32 | (2006.01) |
| C09D 7/61 | (2018.01) |
| C09D 175/04 | (2006.01) |

(52) U.S. Cl.
CPC ............ *H05K 9/0083* (2013.01); *C09D 5/32* (2013.01); *C09D 7/61* (2018.01); *C09D 175/04* (2013.01); *H05K 9/0049* (2013.01)

(58) Field of Classification Search
CPC .... C09D 1/00; C09D 5/00; C09D 4/00; C23C 18/02; C23C 18/06; C23C 18/08; C23C 18/143; H05K 1/0373; H05K 2201/0129; H05K 2201/09118; H05K 2203/0783; H05K 2203/178; H05K 3/181; H05K 3/22

See application file for complete search history.

(56) References Cited

U.S. PATENT DOCUMENTS

| 5,910,524 | A | * | 6/1999 | Kalinoski | F16J 15/14 428/447 |
| 2003/0015334 | A1 | * | 1/2003 | Clement | H05K 9/0045 174/50 |
| 2003/0091777 | A1 | * | 5/2003 | Jones | C09J 7/38 428/40.1 |
| 2003/0190498 | A1 | * | 10/2003 | Fujieda | H01Q 17/001 427/128 |

(Continued)

*Primary Examiner* — William H. Mayo, III
*Assistant Examiner* — Krystal Robinson
(74) *Attorney, Agent, or Firm* — Soroker Agmon Nordman

(57) ABSTRACT

A method, system and paint for suppressing emission of high frequency electromagnetic radiation from an electronic system, the electronic system including at least one power supply unit, at least one printed circuit board (PCB) and at least one integrated circuit are provided. The method includes providing an electrically conductive housing configured to accommodate and encase the electronic system, the housing having an inner conductive surface, and applying a layer of an electromagnetic absorbing paint to the inner conductive surface of the housing to substantially cover the inner surface by the layer, the electromagnetic absorbing paint comprises a liquid matrix and an electromagnetic absorbing material.

23 Claims, 5 Drawing Sheets

(56) References Cited

U.S. PATENT DOCUMENTS

| | | | |
|---|---|---|---|
| 2003/0215644 A1* | 11/2003 | Deshpande | C23C 26/00 428/416 |
| 2005/0161641 A1* | 7/2005 | Gros | C09D 5/10 252/500 |
| 2015/0309184 A1* | 10/2015 | Viscovic | A61N 5/10 600/1 |
| 2020/0053920 A1* | 2/2020 | Ghosh | C08K 3/04 |

* cited by examiner

METHOD, SYSTEM AND PAINT FOR EMI SUPPRESSION

FIELD OF THE INVENTION

The present invention generally relates to electronic equipment and, more specifically, to enclosures for electronic equipment that suppress emission of electromagnetic interference (EMI) from electronic systems.

BACKGROUND OF THE INVENTION

During normal operation, electronic equipment typically generates undesirable electromagnetic energy that can interfere with the operation of other electronic equipment. These disturbances, known as electromagnetic interference (EMI), are characterized by conducted emissions and radiated emissions. EMI emissions can be of a wide range of frequencies and may interfere with radio and wire communication. With the advance of computer networking and the ever increasing operating rates of electronic systems, EMI radiation frequencies may extend into tens and even hundreds of GHz.

Electro Magnetic Compatibility (EMC) for electronic and electro-mechanical products is mandatory in many countries. For example, in the United States, the Federal Communications Commission (FCC), which is in charge of the regulation of radio and wire communication, set limits on the radiated and conducted emissions of unintentional radiator. An unintentional radiator is defined as a device that is not designed to produce electromagnetic waves. Nearly all digital devices that are not designed for RF communication nevertheless generate radio frequency electromagnetic waves and thus can be considered unintentional radiators.

To minimize the problems associated with EMI and to meet the requirements of electromagnetic compatibility (EMC), sources of undesirable electromagnetic energy may be shielded and electrically grounded. The shields may be constructed to reduce EMI at a particular wavelength, or a range of wavelengths.

EMI shields are typically constructed of a highly-conductive material operating to internally reflect the radiation component of the EMI and to drain the conducted component of the EMI to electrical ground. In the abstract, an ideal EMI shield would consist of a completely enclosed housing constructed of an infinitely-conductive material without any apertures, seams, gaps, or vents. However, in all practical applications, the enclosure is constructed of a finitely-conducting material and has some apertures and seams that inhibit the beneficial Faraday Cage effect by forming discontinuities in the conductivity of the enclosure, and through which the radiation component of the EMI may leak. Moreover, by the known Babinet principle, the apertures can act as slot antennae, resulting in the enclosure itself becoming a secondary source of EMI. Apertures may be intentional apertures, such as ventilation openings, or may be apertures inherent to the method of construction such as seams between adjacent construction parts and around connection ports. EMI shielded enclosures may also induce resonances of the electromagnetic energy within the cavity. For example, under certain conditions, reflections of the electromagnetic field at the boundaries of the cavity can create standing waves within the cavity. Such resonances tend to increase the peak amplitudes of the electromagnetic energy within the enclosure through additive effects of the multiple reflections and thus may reduce the apparent shielding effectiveness at the resonant frequencies.

The shielding effectiveness of an EMI enclosure having an aperture is a function of the wavelength of the EMI. Generally, the shielding effectiveness is improved when the largest dimension of the aperture is small compared to the wavelength (i.e., less than one-half the wavelength). Reducing the largest dimension of any aperture, as well as reducing the total number of apertures, tends to increase the EMI protection or shielding effectiveness of the enclosure. Special methods of manufacture may be employed to improve shielding effectiveness by minimizing gaps using special RF gaskets and by structurally securing different parts of the enclosure to be tightly fixed to each other.

However, some apertures are unavoidable and as operating frequencies increase, the associated wavelengths of induced EMI decrease, leading to a reduction in shielding effectiveness for any non-ideal EMI enclosure. For frequencies and/or associated harmonies of more than 10 GHZ, the wavelengths of the EMI emission become of the same order of magnitude as that of apertures dimensions, resulting in increase of both resonance phenomena and leakage. At such operational rates, additional means are required in order to suppress EMI emission from electronic equipment and to meet EMC requirements.

One known method for suppressing EMI emission from electronic equipment is to place absorbing pads around specific components, identified as sources of emission, to individually suppress each such source. Additionally, or alternatively, absorbing pads may be placed at other locations within the enclosure cavity, including the enclosure walls. Other known methods involve different kinds of EMI filters placed at crucial positions inside the enclosure or the use of EMI suppressing sheets or films. However, these methods are cumbersome, labor and time consuming and involve large amounts of material and high costs.

There is therefore a continuous need for simple and low-cost methods and means for suppressing EMI emission from electronic equipment, in particular for suppressing high frequency EMI emission at megahertz through gigahertz frequencies.

SUMMARY OF THE INVENTION

The present invention is aimed at providing easily implemented low-cost methods and systems for suppressing EMI emission from electronic systems.

While reducing the present invention to practice, it was found that applying a thin layer of an EMI absorbing paint directly to the inner surface of a conductive enclosure of an electronic system, significantly reduces EMI emission from the enclosure.

One aspect of the present invention is a method for suppressing emission of high frequency electromagnetic radiation from an electronic system that comprises at least one circuit board (PCB), at least one power supply, at least one integrated circuit and optionally one or more ports adapted to connect to a pluggable interconnecting means. The method comprises: providing an electrically conductive housing configured to accommodate and encase the electronic system and applying a thin layer of an electromagnetic absorbing paint to the inner surface of the housing to substantially cover said inner surface. The electromagnetic absorbing paint comprises a liquid matrix and an electromagnetic absorbing material. Preferably, the layer of the electromagnetic absorbing paint has a thickness in the range of 30 to 80 µm and covers 90% or more of the housing's inner conductive surface. According to some embodiments of the invention, the electronic system produces electromagnetic radiation at frequencies of 5 or more GHz. According to some embodiments of the invention, the electromagnetic absorbing paint is selected to absorb electromagnetic radiation in the range of 5 to 100 GHz. The electronic system may be, for example, a network switch.

According to some embodiments of the invention, the electromagnetic absorbing material comprises electrically conductive particles and ferromagnetic particles homogeneously suspended in the liquid matrix. The electromagnetic absorbing material may comprise one or more of carbon powder, carbonyl iron powder, sendust, ferrites, iron silicide, conductive polymer, titanium oxide, silica, magnetic alloys, magnetic flakes, steel wool, carbon-impregnated rubber, ferrite in a plastic stranded carrier and clad metals. According to some embodiments of the invention, the electromagnetic absorbing paint comprises 50-80% wt. of said electromagnetic absorbing material. According to some embodiments of the invention, the liquid matrix is a polymeric liquid comprising a polymer selected from the group consisting of polyurethane, polyacrylate and silicone. For example, the liquid matrix may be a solvent-based polyurethane lacquer. Preferably, the liquid matrix has a low emission of volatile organic compounds (VOC).

According to some embodiments of the invention, the housing comprises an electrically conductive material selected from the group consisting of copper, aluminum, gold, tin, steel, stainless steel, nickel and any combination thereof. According to some embodiments of the invention, the housing comprises at least two complementary parts and the step of proving the housing comprises providing the parts separately. According to these embodiments, the step of applying the lossy paint comprises applying a layer of the paint to the inner surfaces of each of the parts and then assembling the housing to encase and accommodate the electronic system. The at least two parts may be, for example, a chassis on which components of the electronic system are mounted and a complementary lid which is removably connectable to the chassis, wherein the chassis and the lid, when properly connected, substantially enclose the electronic system from all sides.

Another aspect of the present invention is an EMI suppressing system for suppressing emission of high frequency electromagnetic radiation from an electronic system that comprises at least one circuit board (PCB), at least one power supply, at least one integrated circuit and optionally at least one port adapted to connect to a pluggable interconnect means. The EMI suppressing system comprises an electrically conductive housing configured to accommodate and encase the electronic system and a layer of electromagnetic absorbing paint that substantially covers the inner conductive surface of the housing wherein electromagnetic absorbing paint comprises a liquid matrix and an electromagnetic absorbing material. According to some embodiments of the invention, the electronic system produces electromagnetic radiation at frequencies of 5 or more GHz and the electromagnetic absorbing paint is selected to absorb electromagnetic radiation in the range of 5 to 100 GHz. The electronic system may be, for example, a network switch.

Preferably, the housing comprises at least two complementary parts and at least one aperture. The at least two parts may be, for example, a chassis on which components of the electronic system are mounted and a complementary lid which is removably connectable to the chassis, wherein the chassis and the lid, when properly connected, substantially enclose the electronic system from all sides. Preferably, the housing comprises an electrically conductive material selected from the group consisting of copper, aluminum, gold, tin, steel, stainless steel, nickel and any combination thereof. The electromagnetic absorbing material may comprise electrically conductive particles and ferromagnetic particles homogeneously suspended in the liquid matrix. The electromagnetic absorbing material may comprise one or more of carbon powder, carbonyl iron powder, sendust, ferrites, iron silicide, conductive polymer, titanium oxide, silica, magnetic alloys, magnetic flakes, steel wool, carbon-impregnated rubber, ferrite in a plastic stranded carrier and clad metals. Preferably, the invention, the electromagnetic absorbing paint comprises 50-80% wt. of the electromagnetic absorbing material. According to some embodiments of the invention, the liquid matrix is a polymeric liquid comprising a polymer selected from the group consisting of polyurethane, polyacrylate and silicone. For example, the liquid matrix may be a solvent-based polyurethane lacquer. Preferably, the liquid matrix has a low emission of volatile organic compounds (VOC).

Yet, a further object of the invention is an electromagnetic absorbing paint comprising 20 to 40% wt. solvent-based polymer composition, 40 to 70% wt. ferromagnetic particles, 5 to 15% wt. conductive polymer, 5 to 15% wt. carbon black and 3 to 8% dielectric material. In some embodiments, the polymer is polyurethane, acrylic polymer, silicone or a combination thereof. The ferromagnetic particles can be carbonyl iron powder, sendust, ferrite, iron silicide, magnetic alloy powder, magnetic flakes or any combination thereof; the conductive polymer may be poly(thiophene) (PT), poly(acetylene) (PAC), poly(p-phenylenesulfide) (PPS), poly(pyrrole) (PPY), polyaniline (PANI), poly(p-phenylenevinylene) (PPV) or a combination thereof and the dielectric material may be titanium oxide. In some embodiments, the electromagnetic absorbing paint comprises 50-80% wt. suspended solids.

BRIEF DESCRIPTION OF THE DRAWINGS

The advantages of the invention may be better understood by referring to the following description, taken in conjunction with the accompanying drawings, in which.

DETAILED DESCRIPTION OF THE INVENTION

Figure 1A:
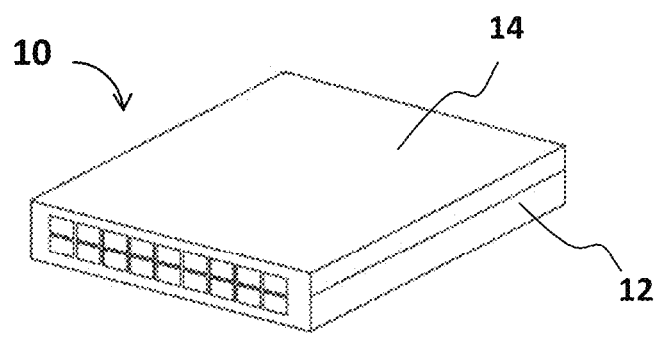
FIGS. 1A and 1B are perspective views of an exemplary housing configured to accommodate and encase an electronic system, in assembled and disassembled configurations, respectively.

The present invention relates to an EMI shield, such as a highly-conductive metal enclosure, that is covered by a thin layer of electromagnetic absorbing, or lossy, paint to suppress a portion of the EMI, thereby enhancing the performance of the EMI shield over a range of operational frequencies. The electromagnetic absorbing paint comprises a liquid matrix and an electromagnetic absorbing material. The electromagnetic absorbing paint is applied directly on the conductive surface of the enclosure, forming a direct contact between metal and paint.

While reducing the present invention to practice, it was found that the application of a thin layer of an electromagnetic absorbing paint directly to the inner metallic surface of a conductive enclosure significantly attenuates emission of high frequency EMI from the enclosure. It was also found that adding a second layer of the absorptive paint over the first layer does not significantly contribute to EMI attenuation, meaning that a thin layer of the paint is sufficient to suppress EMI emission generated by an electronic system disposed in the enclosure's cavity. Notably, the application of the thin layer of the lossy paint to the inner conductive surface of the enclosure eliminates the need to separately shield individual components of the system. It also eliminates the need to use adhesives, or other attaching means, for securing the absorbing material to the enclosure walls, thus, significantly reduces material, labor and costs compared to existing methods.

Lossy materials can be used to suppress EMI phenomena, for example, by converting the electromagnetic energy into another form of energy, such as thermal energy. In some embodiments, the lossy material can be composed of ferrite-like material mixed in a polyurethane-based, acrylic-based, or silicone-based paint. In other embodiments, the lossy material can be composed of a lossy filler material, such as carbon powder, carbon fiber powder and/or conductive polymers. The lossy materials can be configured in a liquid form for coating the inner surfaces of the enclosure. Some examples of lossy materials are carbon, iron, carbonyl iron powder, sendust, ferrites, iron silicide, magnetic alloys, magnetic flakes, steel wool, conductive polymers and combinations thereof. Other materials used to achieve electromagnetic suppression effects include alumina ($Al_2O_3$), sapphire, silica ($SiO_2$), titanium dioxide ($TiO_2$), and combinations thereof.

Without wishing to be held to any one theory, it is currently believed that the attenuation of the EMI by the thin layer of absorbing paint is at least partially attributable to the diffusion of the eddy currents generated on the conductive surface of the internal walls into the paint layer, which is in close contact with the metal surface and has a considerably lower conductance and a higher permeability, where they are reduced to heat by Ohmic and magnetic energy losses.

As used herein, the term EMI should be considered to refer to electromagnetic radiation interference.

As used herein, the terms EMI absorbing paint, electromagnetic absorbing paint and a lossy paint, are used interchangeably to describe a composition that dissipates electromagnetic energy passing through it and that can be applied to a surface as paint.

As used herein, the term electronic system refers to a complete functional system that includes at least one power supply unit, at least one integrated circuit, at least one printed circuit board (PCB) and optionally one or more ports adapted to connect to a pluggable interconnecting means. The electronic system is encased in an enclosure and is a standalone functional unit. The electronic system may be an electronic information/data system, an electronic switching system, an electronic control system, an electronic communication system, etc. Examples of electronic systems, for which the present invention is applicable, include computers, network switches, modems, memory units, cellular phones, etc.

In one aspect, the invention relates to an EMI suppressing system for suppressing emission of high-frequency EMI from an electronic system. The system includes an electrically-conductive shield configured for housing a complete functional system. The shielding system also includes an electromagnetic absorbing paint material disposed on the internal side of the electrically-conductive shield. The combined electrically-conductive shield and electromagnetic absorbing material attenuate the emission of electromagnetic energy with respect to the system shielded by the original, not covered with the absorber, enclosure.

According to some embodiments, the electrically-conductive shield is fabricated from a highly conductive material, preferably metal, such as aluminum, copper, nickel, tin, silver, gold, beryllium, phosphor bronze, steel, stainless steel, and combinations thereof.

According to some embodiments, the energy absorptive material in the lossy paint comprises one or more of the group consisting of a conductive material, carbonyl iron powder, sendust, ferrite, iron silicide, magnetic alloys, magnetic flakes, carbon powder, carbon fibers powder, and a conductive polymer. The conductive polymer may be, for example, poly(thiophene) (PT), poly(acetylene) (PAC), poly (p-phenylenesulfide) (PPS), poly(pyrrole) (PPY), polyaniline (PANI), poly(p-phenylenevinylene) (PPV), etc.

In some embodiments, the energy absorptive paint comprises electromagnetic absorbing particles suspended in a liquid matrix. The liquid matrix is preferably a solvent-based polymer comprising polymer or prepolymer components in a solvent. Such polymeric liquids, after being applied to a surface, are cured and dried to remove the solvent, forming a polymeric layer on the surface. The polymer is preferably selected from the group consisting of polyurethane, polyacrylate and silicone. In some embodiment the liquid matrix is a commercially available polymeric lacquer or varnishes, also known as polymer coatings, such as commercially available polyethylene-based, silicone-based or acrylic-based coatings, for example, coatings manufactured by Lord Corporation, Cary, N.C., USA.

In some embodiments, the energy absorptive paint comprises one or more of the group consisting of electrically conductive material, carbon, carbonyl iron powder, sendust, ferrites, iron silicide, conductive polymer, magnetic alloys, magnetic flakes, steel wool, carbon-impregnated rubber, ferrite in a plastic stranded carrier, metal foils, metal clad materials including iron, nickel, and iron/nickel compositions, paste composites selected from the group consisting of iron, nickel, copper with epoxy, and lacquer binders.

In some embodiments, the lossy material can be combined with other materials to achieve a desired effect. For example, the lossy material can be combined with anticorrosive agents and/or with fire retardants to meet flammability standards.

Figure 1B:
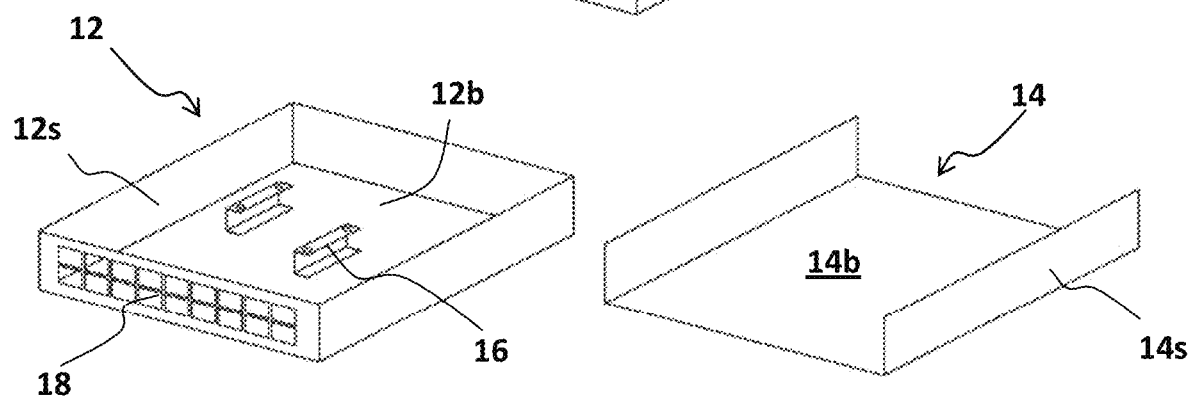

Referring to the drawings, FIGS. 1a and 1b schematically illustrate an exemplary housing 10 configured to accommodate and substantially enclose an electronic system. Housing 10 comprises a main frame portion, or chassis, 12 and a lid 14 removably connectable to portion 12. When service of components in housing 10 is needed, lid 14 can be removed to access the inside of the housing. Chassis 12 may be provided with one or more internal ribs and/or protrusions 16 for receiving and supporting electronic components of the electronic system, and with apertures 18. Apertures 18 may be air flow ventilation openings and/or ports configured to receive pluggable interconnect means. When assembled to encase the electronic system, housing 10 substantially encloses the electronic system from all sides. Housing 10 comprises a highly conductive reflecting material, preferably metal, such as copper, aluminum, gold, tin, steel and nickel. Preferably the housing is fabricated from a metal sheet. Alternatively, housing 10 may be made of combinations of different metals or of different conducting materials, such as steel and stainless steel, nickel-coated copper, phosphor bronze, tin plated steel, etc., or combinations of a conductive material with an electrical insulator, such as plastic coated with an electrically conducting or metallic layer, as is common in the packaging of small, light-weight electronic systems. In the latter case, the conductive metal surface is oriented inwardly, i.e., constitutes the inner surface $10i$ of the housing while the insulated surface is oriented outwardly and constitutes the external surface $10e$ of the housing. In all cases, inner surface $10i$ of housing 10 is highly conductive.

Figure 2:
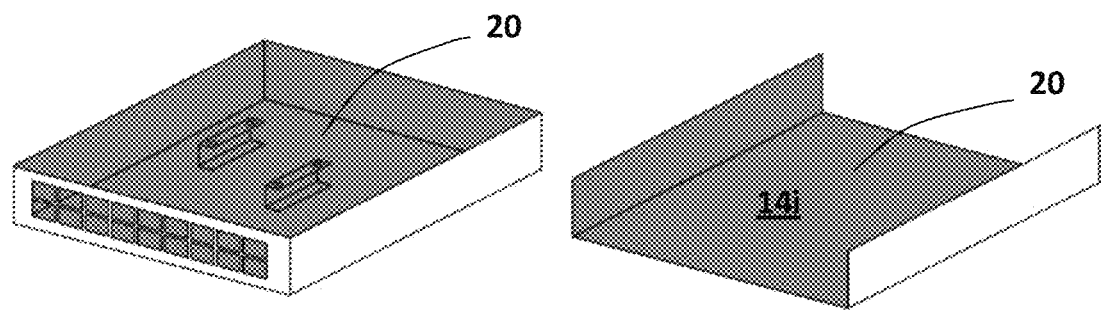
FIG. 2 is a perspective view of the housing of FIG. 1 having its inner surface covered by a layer of an EMI absorbing paint, in accordance with an embodiment of the present invention.
Figure 3:
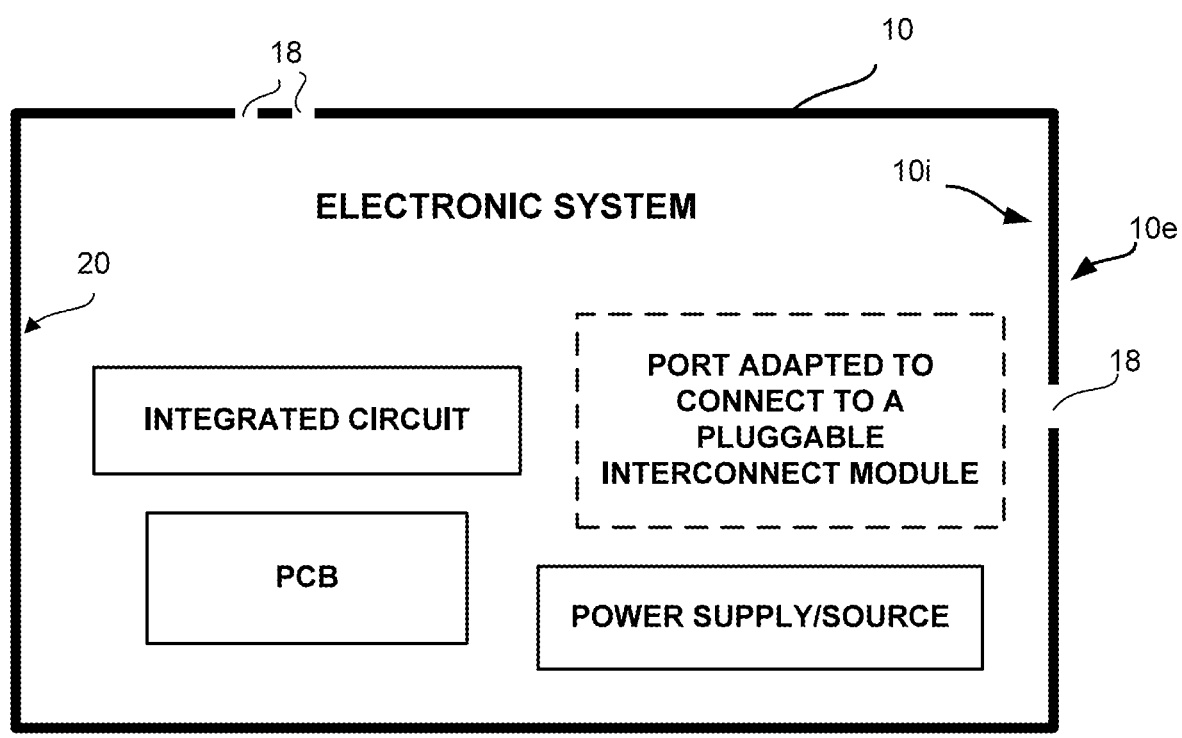
FIG. 3 is a schematic block diagram of an embodiment of the invention showing the main components of the electronic system.

In accordance with the present invention, a significant portion of inner surface $10i$ is covered by a layer 20 of electromagnetic absorbing paint, as illustrated in FIGS. 2 and 3. Layer 20 is preferably 30 to 80 mµ thick and substantially covers inner surfaces of both bottom (12b, 14b) and side walls (12s, 14s) of parts 12 and 14. In this context, the term substantially covers should be interpreted as covering more than about 90% of the surface area. The electromagnetic absorbing, or lossy, paint comprises electromagnetic absorbing or otherwise suppressing material in a liquid matrix and may be applied to inner surface $10i$ by spraying or brushing to form layer 20. The liquid matrix may be a commercially available lacquer, such as polyurethane-, acrylic-, or silicone-based lacquer. After application, the sprayed, or otherwise applied, paint is cured to remove the solvent, leaving a layer of lossy paint on the metal surface.

In some embodiments, the electromagnetic absorbing material is broadband in nature, absorbing electromagnetic energy over a broad range of frequencies, including high frequencies of up to 100 GHz and even more. Preferably, the electromagnetic material comprises high frequency absorbing material. According to some embodiments, the electromagnetic absorbing paint may comprise one or more of electrically conductive material, carbonyl iron powder, sendust, ferrite, iron silicide, magnetic alloys, magnetic flakes, carbon powder, carbon fiber powder, conductive polymer, steel wool, carbon-impregnated rubber, ferrite in a plastic stranded carrier, metal foils, metal clad materials including iron, nickel, and iron/nickel compositions, paste composites selected from the group consisting of iron, nickel, copper with epoxy, lacquer binders.

FIG. 3 schematically illustrates an electronic system enclosed by housing 10. In accordance with the present invention, the electronic system is a complete functioning system comprising at least one power supply unit, at least one printed circuit board (PCB), at least one integrated circuit and optionally one or more ports adapted to connect to a pluggable interconnecting means. The power supply unit may be a power source, or a module connectable to an external power source. Preferably, the absorbing paint has a very low emission of volatiles which is essential for avoiding contamination of the system components by volatiles, in particular when the system comprises optical modules, where volatiles might deposit on active optical components and hamper the operation of these modules.

Figure 6A:
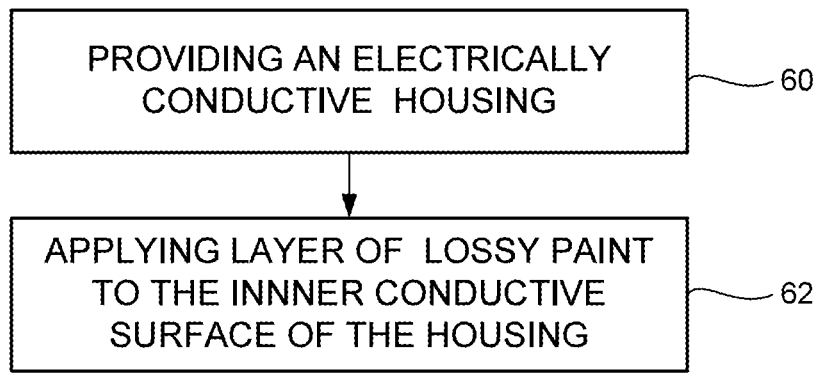
FIGS. 6a and 6b are an overall flow chart, and a detailed flow chart, respectively, illustrating the method of suppressing EMI from an electronic system, in accordance with embodiments of the present invention.
Figure 6B:
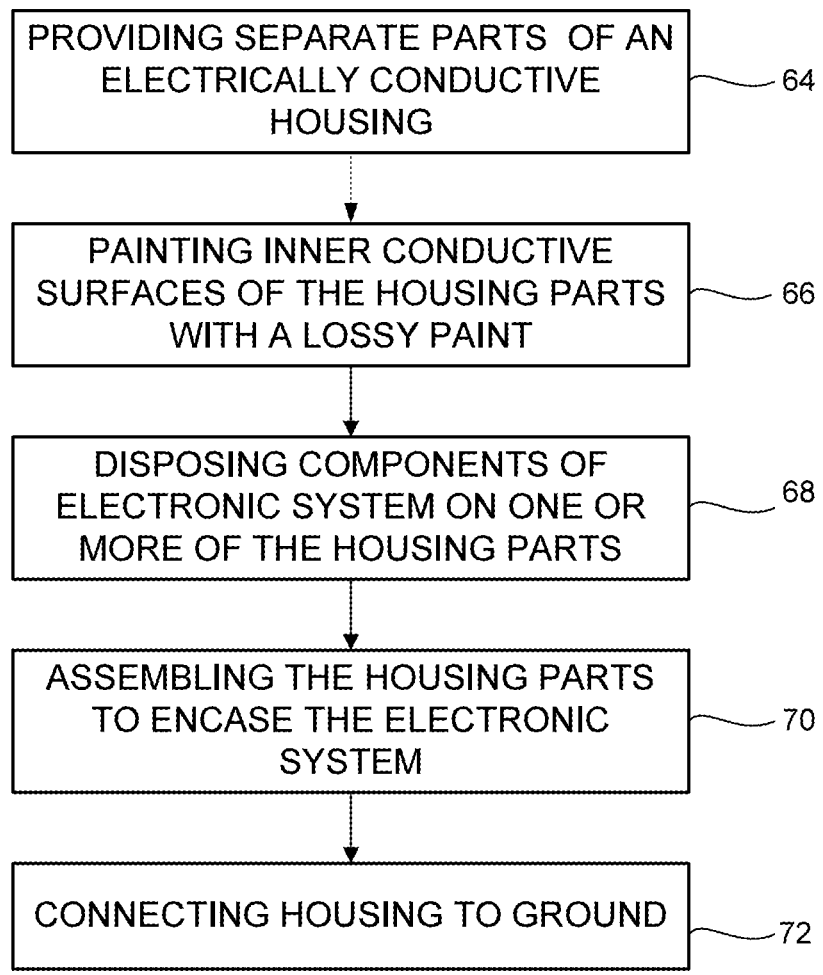

The EMI suppressing system of the invention, comprising a conductive enclosure and a layer of lossy paint substantially covering the conductive inner surface of the enclosure, can be a newly fabricated enclosure or the lossy paint can be added to an existing enclosure by applying a first, high-frequency, EMI absorbing paint to a second, EMI reflecting inner surface of the enclosure. FIG. 6 outline the main steps of the method of the invention, according to which a layer of a lossy paint is applied (step 62) to the inner conductive surface of an electrically conducting housing (step 60). The parts constituting the housing are provided separately (step 64) and after their inner surfaces are painted with the lossy paint (step 66) and the components of the electronic system are mounted thereon (step 68), the housing parts are assembled to encase the electronic system within the housing (step 70). The housing is then connected to ground (step 72) to drain conductive emissions.

Example 1

A composition comprising carbonyl iron powder, carbon powder, titanium dioxide and a conductive polymer in polyurethane matrix was tested in a microstrip test setting to study the effectiveness of the composition as EMI suppressor.

Figure 4:
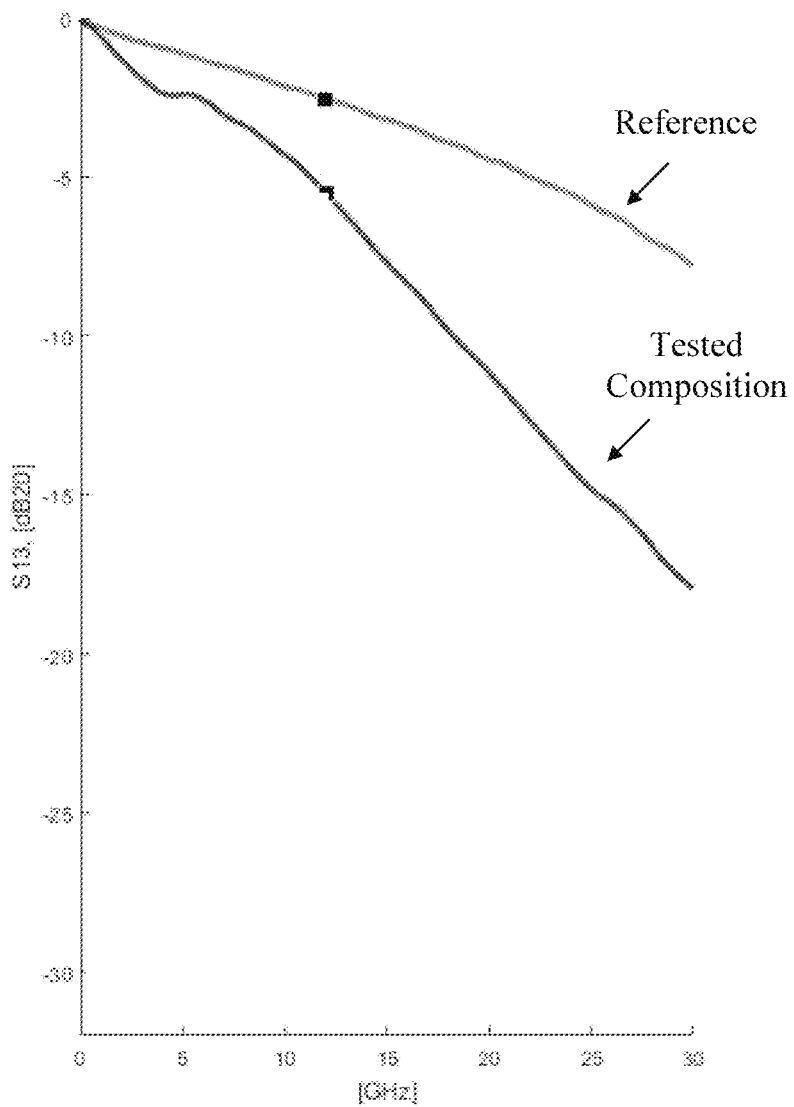
FIG. 4 is a graph representing insertion loss as function of frequency measured in a microstrip test configuration for a layer of a polyurethane matrix as compared to insertion loss measured without the layer (reference)

FIG. 4 presents the transmission insertion loss as function of frequency measured in the microstrip test configuration with the tested composition compared to the insertion loss measured without the composition (reference). As can be seen, the composition attenuates the RF signal at all measured frequencies and the attenuation effect increases with frequency. At frequencies above about 10 GHZ the composition attenuates radiation by more than 3 dB and above about 20 GHz by 8 dB or more.

Example 2

An electromagnetic absorbing paint was prepared by mixing solvent-based polyurethane coating with carbonyl iron powder, carbon black, titanium dioxide, and polyaniline to obtain a paint of the following composition (in weight percent): n 22.4% solvent-based polyurethane, 59.2% carbonyl iron, 7.2% polyaniline, 6.3% carbon powder and 4.9% $TiO_2$.

The EMI suppressing effect of the electromagnetic absorbing paint was studied on an Ethernet switch operating at 25.781 Gbps rate. The Ethernet switch was housed in an enclosure similar in structure to the housing depicted in FIG. 1, made of 1 mm thick aluminum sheet. Tests were performed for the switch in its original enclosure (i.e., without paint), with one 0.002 inch thick dry layer of the electromagnetic absorbing paint, and with two such layers of absorbing paint.

Measurements were performed in a semi-anechoic chamber that incorporates a turntable allowing rotation of 360° and a measuring antenna. The tested switch was placed on the turntable at a height of 1 m above the ground plane, was turned on and allowed to operate normally. The distance between the antenna and the switch was 3 m. Radiated Emission was measured at a frequency of 25.781 GHz frequency. To find the highest emission, the turntable was rotated 360° and the measuring antenna height was swept from 1 to 2 m above the ground plane and the antenna was rotated to take measurements for both horizontal and vertical planes of polarization.

Figure 5:
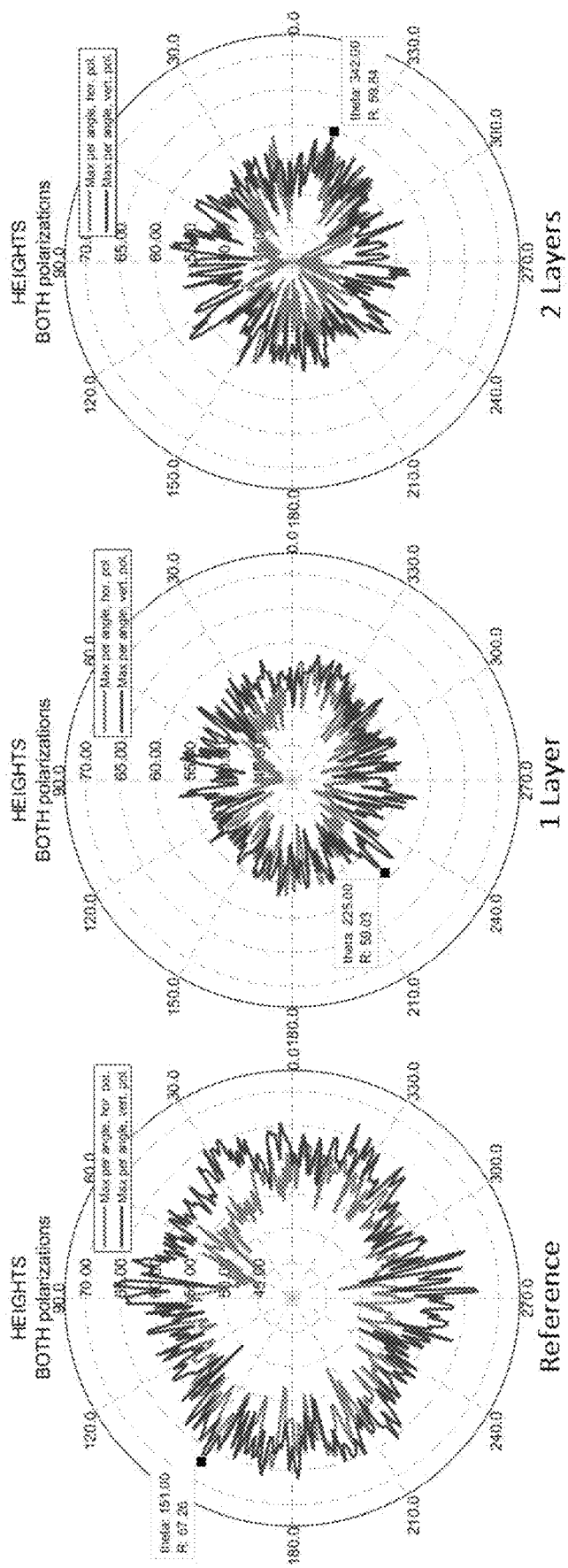
FIG. 5 graphically presents maximum measured radiated emissions (dBµV/m) as function of the rotation angle of the of the tested system: (a) encased in a prior art shield (reference); (b) encased in a shield with one layer of lossy paint; (c) encased in shield with two layers of lossy paint; black line represents vertical polarization, gray line represents horizontal polarization.

FIG. 5 graphically presents the results obtained for the unpainted housing (reference, 3a), for the housing with one layer of absorbing paint (3b) and for the housing with two layers of absorbing paint (3c). The polar graphs represent the highest radiated emission (measured as the field strength in μV/m) as a function of the emission direction for both vertical and horizontal polarizations.

The results clearly indicate that the paint-treated enclosure provides an improvement, or difference in attenuation, of at least about 8 dB. The results also indicate that the contribution of a second layer of absorbing paint is negligible.

Although the invention has been described in conjunction with specific embodiments thereof, it is evident that modifications and variations are possible without departing from the scope of the invention. Accordingly, it will be appreciated by persons skilled in the art that the present invention is not limited to what has been particularly shown and described hereinabove. Rather the scope of the present invention is defined only by the claims which follow.

The invention claimed is:

1. A method for suppressing emission of high frequency electromagnetic radiation from an electronic system, the electronic system comprising at least one power supply unit, at least one printed circuit board (PCB) and at least one integrated circuit, the method comprising:
providing an electrically conductive housing configured to accommodate and encase said electronic system, the housing having an inner conductive surface; and
applying a layer of an electromagnetic absorbing paint to the inner conductive surface of the housing to substantially cover said inner surface by said layer, said electromagnetic absorbing paint comprises a liquid matrix and an electromagnetic absorbing material;
wherein said electromagnetic absorbing material comprises electrically conductive particles and ferromagnetic particles homogeneously suspended in said liquid matrix.

2. The method according to claim 1,
wherein said electromagnetic absorbing paint is selected to absorb electromagnetic radiation in the range of 5 to 100 GHz.

3. The method according to claim 1, wherein the electronic system further comprises at least one port adapted to connect to a pluggable interconnecting means.

4. The method according to claim 2, wherein said layer of an electromagnetic absorbing paint is applied to cover 90% or more of said inner conductive surface.

5. The method according to claim 1, wherein the electronic system produces electromagnetic radiation at frequencies of 5 or more GHz.

6. The method according to claim 1, wherein said layer has a thickness in the range of 30 to 80 μm.

7. The method according to claim 1, wherein said electronic system is a network switch.

8. The method according to claim 1, wherein said electromagnetic absorbing paint comprises 50-80% wt. of said electromagnetic absorbing material.

9. The method according to claim 1, wherein said electromagnetic absorbing material comprise one or more of carbon powder, carbonyl iron powder, sendust, ferrites, iron silicide, conductive polymer, titanium oxide, silica, magnetic alloys, magnetic flakes, steel wool, carbon-impregnated rubber, ferrite in a plastic stranded carrier and clad metals.

10. The method according to claim 1, wherein said a liquid matrix is a polymeric liquid comprising a polymer selected from the group consisting of polyurethane, acrylic polymer and silicone.

11. The method according to claim 1, wherein said liquid matrix is a solvent-based polyurethane lacquer.

12. The method according to claim 1, wherein said housing comprises electrically conductive material selected from the group consisting of copper, aluminum, gold, tin, steel, stainless steel, nickel and any combination thereof.

13. The method according to claim 1, wherein the housing comprises at least two complementary parts, wherein the step of proving comprises providing said at least two parts separately, wherein the step of applying comprises applying a layer of paint to the inner surfaces of each of said at least two parts and wherein the method further comprises assembling the housing to encase and accommodate the electronic system after the step of applying.

14. The method according to claim 13, wherein said at least two parts comprise a chassis on which components of the electronic system are mounted and a complementary lid removably connectable to said chassis.

15. An electromagnetic interference (EMI) suppressing system for suppressing emission of high frequency electromagnetic radiation from an electronic system, the electronic system comprising at least one circuit board (PCB), at least one power supply, the EMI suppressing system comprising:
an electrically conductive housing configured to accommodate and encase the electronic system, the housing comprising at least two complementary parts and housing having an inner conductive surface; and
a layer of electromagnetic absorbing paint substantially covering the inner surface of the housing, wherein said electromagnetic absorbing paint comprises a liquid matrix and an electromagnetic absorbing material;
wherein said electromagnetic absorbing material comprises electrically conductive particles and ferromagnetic particles homogeneously suspended in said liquid matrix.

16. The EMI suppressing system of claim 15, wherein the electronic system further comprises at least one port adapted to connect to a pluggable interconnecting means.

17. The EMI suppressing system of claim 15, wherein said layer of an electromagnetic absorbing paint covers 90% or more of said inner conductive surface.

18. The EMI suppressing system of claim 15, wherein the electronic system produces electromagnetic radiation at frequencies of 5 or more GHz and wherein said electromagnetic absorbing paint is selected to absorb electromagnetic radiation in the range of 5 to 100 GHz.

19. The EMI suppressing system of claim 15, wherein said layer is 30 to 80 μm thick.

20. The EMI suppressing system of claim 15, wherein said electronic system is a network switch.

21. The EMI suppressing system of claim 15, wherein said electromagnetic absorbing material comprise one or more of carbon powder, carbonyl iron powder, sendust, ferrites, iron silicide, conductive polymer, titanium oxide, silica, magnetic alloys, magnetic flakes, steel wool, carbon-impregnated rubber, ferrite in a plastic stranded carrier and clad metals.

22. The EMI suppressing system of claim 15, wherein said a liquid matrix is a polymeric liquid comprising a polymer selected from the group consisting of polyurethane, polyacrylate and silicone.

23. The EMI suppressing system of claim 15, wherein said housing comprises an electrically conductive material selected from the group consisting of copper, aluminum, gold, tin, steel, stainless steel, nickel and any combination thereof.

\* \* \* \* \*